US012683260B2

(12) United States Patent
Ganesan

(10) Patent No.: US 12,683,260 B2
(45) Date of Patent: *Jul. 14, 2026

(54) ANTENNA PORT TERMINATION IN ABSENCE OF POWER SUPPLY

(71) Applicant: pSemi Corporation, San Diego, CA (US)

(72) Inventor: Sivakumar Ganesan, Austin, TX (US)

(73) Assignee: PSEMI CORPORATION, San Diego, CA (US)

( * ) Notice: Subject to any disclaimer, the term of this patent is extended or adjusted under 35 U.S.C. 154(b) by 10 days.

This patent is subject to a terminal disclaimer.

(21) Appl. No.: 18/825,619

(22) Filed: Sep. 5, 2024

(65) Prior Publication Data

US 2024/0429584 A1      Dec. 26, 2024

Related U.S. Application Data

(63) Continuation of application No. 18/497,928, filed on Oct. 30, 2023, now Pat. No. 12,113,263, which is a continuation of application No. 18/155,331, filed on Jan. 17, 2023, now Pat. No. 11,837,768, which is a continuation of application No. 17/808,019, filed on Jun. 21, 2022, now Pat. No. 11,581,621, which is a continuation of application No. 16/751,042, filed on Jan. 23, 2020, now Pat. No. 11,380,970.

(51) Int. Cl.
| | |
|---|---|
| *H01P 1/24* | (2006.01) |
| *H01Q 1/50* | (2006.01) |
| *H03K 17/687* | (2006.01) |

(52) U.S. Cl.
CPC ................. *H01P 1/24* (2013.01); *H01Q 1/50* (2013.01); *H03K 17/687* (2013.01)

(58) Field of Classification Search
CPC ........... H01P 1/24; H01Q 1/50; H03K 17/687
See application file for complete search history.

(56) References Cited

U.S. PATENT DOCUMENTS

| | | | |
|---|---|---|---|
| 5,867,127 | A | 2/1999 | Black et al. |
| 9,594,147 | B2 | 3/2017 | Han et al. |
| 11,380,970 | B2 | 7/2022 | Ganesan |
| 11,581,621 | B2 | 2/2023 | Ganesan |
| 11,837,768 | B2 | 12/2023 | Ganesan |
| 12,113,263 | B2 | 10/2024 | Ganesan |

(Continued)

OTHER PUBLICATIONS

Non-Final Office Action for U.S. Appl. No. 17/808,019, filed Jun. 21, 2022 on behalf of pSemi Corporation Mail Date: Oct. 4, 2022 6 pages.

(Continued)

*Primary Examiner* — William Hernandez
(74) *Attorney, Agent, or Firm* — Steinfl + Bruno LLP

(57) ABSTRACT

Methods and devices to address antenna termination in absence of power supplies within an electronic circuit including a termination circuit and a switching circuit. The devices include regular NMOS devices that decouple the antenna from the switching circuit in absence of power supplies while the antenna is coupled to a terminating impedance having a desired impedance value through a native NMOS device. The antenna is coupled with the switching circuit via the regular NMOS device during powered conditions while the antenna is decoupled from the terminating impedance.

20 Claims, 5 Drawing Sheets

(56)  References Cited

U.S. PATENT DOCUMENTS

| 2017/0033454 | A1 |  | 2/2017 | Van Bezooijen et al. |
| 2021/0210847 | A1 |  | 7/2021 | Su et al. |
| 2021/0234246 | A1 |  | 7/2021 | Ganesan |
| 2022/0244374 | A1 | * | 8/2022 | Soltanaghaei .......... G01S 13/75 |
| 2022/0393327 | A1 |  | 12/2022 | Ganesan |
| 2023/0223672 | A1 |  | 7/2023 | Ganesan |
| 2024/0136694 | A1 |  | 4/2024 | Ganesan |

OTHER PUBLICATIONS

Non-Final Office Action for U.S. Appl. No. 18/155,331, filed Jan. 17, 2023 on behalf of pSemi Corporation Mail Date: Jun. 30, 2023 8 pages.

Notice of Allowance for U.S. Appl. No. 17/808,019, filed Jun. 21, 2022 on behalf of pSemi Corporation; Mail Date Oct. 27, 2022; 7 pages.

Notice of Allowance for U.S. Appl. No. 18/155,331, filed Jan. 17, 2023 on behalf of pSemi Corporation Mail Date: Sep. 27, 2023 7 pages.

Notice of Allowance for U.S. Appl. No. 18/497,928, filed Oct. 30, 2023 on behalf of pSemi Corporation Mail Date: Jul. 10, 2024 8 pages.

Notice of Allowance issued for U.S. Appl. No. 16/751,042, filed Jan. 23, 2020, on behalf of pSemi Corporation. Mail Date: Mar. 2, 2022. 9 Pages.

* cited by examiner

ANTENNA PORT TERMINATION IN ABSENCE OF POWER SUPPLY

CROSS-REFERENCE TO RELATED APPLICATIONS

The present application is a continuation of U.S. Non-Provisional patent application Ser. No. 18/497,928, filed on Oct. 30, 2023 for "Antenna Port Termination In Absence of Power Supply", which is a continuation of U.S. Non-Provisional patent application Ser. No. 18/155,331, filed on Jan. 17, 2023, now U.S. Pat. No. 11,837,768, which is a continuation of U.S. Non-Provisional patent application Ser. No. 17/808,019, filed on Jun. 21, 2022, now U.S. Pat. No. 11,581,621, which is a continuation of U.S. Non-Provisional patent application Ser. No. 16/751,042, filed on Jan. 23, 2020, now U.S. Pat. No. 11,380,970, all of which are herein incorporated by reference in their entireties.

FIELD

The present disclosure is related to antenna port terminations, and more particularly to methods and apparatus for antenna port terminations in the absence of power supply.

BACKGROUND

Throughout this document the term "unpowered" refers to situations in an electronic circuit when some or all DC voltages to an electronic circuit have been removed, e.g., bias voltages applied to the electronic circuit are equal to zero or are floating. The term "powered" refers to situations in an electronic circuit where the electronic circuit has DC voltages applied as it would during RF operation.

Throughout this document the term "native NMOS device" refers to n-type metal oxide semiconductor (NMOS) transistors having a threshold voltage of close to or less than zero volts. The term "regular NMOS device" refers to NMOS transistors with a threshold voltage greater than zero volts.

FIG. 1A shows a prior art electronic circuit (100) including termination circuit (110) and switching circuit (120). The termination circuit (110) comprises an antenna (ANT), switch (S1) controlled by a first supply (Vss) and a termination impedance (Z), serially connected to one another. The switching circuit (120) comprises a plurality of single-pole single-throw (SPST) switches (SPST1, . . . , SPSTn) connecting antenna (ANT) to outputs (OUT1, . . . , OUTn) through respective inputs (IN1, . . . , INn). Each SPST switch (SPSTi), i=1, . . . , n, is controlled by a through control (THi) and a shunt control (SHi). FIG. 1B shows a prior art implementation of an SPST switch wherein the through control (TH) controls the through switch (Sa) and the shunt control (SH) controls the shunt switch (Sb). FIG. 1B' shows an alternative prior art implementation of an SPST switch wherein the through control (TH) controls the through switches (Sax, Say) and the shunt control (SH) controls the shunt switch (Sb).

With further reference to FIGS. 1A-1B, native NMOS devices are typically used to implement switch (S1) and the SPST switches (SPST1, . . . , SPSTn). In the powered condition, in order to connect an input (INi) to the respective output (OUTi), a positive voltage is applied to the through switch (Sa) via the through control (TH) and a negative voltage is applied to the shunt switch (Sb) via the shunt control (SH). In other words, the through switch (Sa) is closed, connecting the input (INi) to output (OUTi) and the shunt switch (Sb) is open, disconnecting the output (OUTi) from GND (or the lower reference voltage). Continuing with the powered condition, in order to disconnect an input (INi) from the corresponding output (OUTi), a negative voltage is applied to the through switch (Sa) via the through control (TH) and a positive voltage is applied to the shunt switch (Sb) via the shunt control (SH). In this case, the through switch (Sa) will be open and the shunt switch (Sb) is closed, connecting the output (OUTi) to the reference voltage (shown here as GND). In the powered condition, the antenna is not terminated, in other words, switch (S1) is open (Vss is a negative voltage) and the signal received by the antenna is routed to a selected output depending on the states of the SPST switches.

In the unpowered condition, it may be desired that the antenna is terminated by a desired impedance (e.g. 50 ohm or any other desired impedance Z). In such a condition, with continued reference to FIGS. 1A-1B, the power supplies are removed and all the through and shunt controls of the switches are experiencing zero bias voltages. As mentioned before, given that switches are implemented with native NMOS devices, switch (S1) is partially or fully closed and the antenna (ANT) is terminated through impedance (Z) to a reference voltage, shown here as GND. However, and for the same reason, switches in the switching circuit (120) are partially or fully closed such that the circuit (120) generates an additional and undesired load parallel to the termination impedance (Z). In other words, in the unpowered condition the antenna (ANT) will not be terminated by the desired impedance (Z) anymore due to such an undesired load imposed by the switching circuit. This creates a challenge when designing electronic circuits requiring a specific desired termination while in unpowered condition.

A solution to the above-mentioned problem is to use regular NMOS devices (with threshold voltages greater than zero) for switches of the SPSTi switches, instead of native NMOS devices, such that in the unpowered condition, the constituent switches of the switching circuit (120) of FIG. 1A are fully off. As a result, there will be no additional undesired load to the antenna. This solution comes at the expense of an Ron*Coff tradeoff, wherein Ron and Coff represent respectively the resistance of the NMOS devices in the ON state and the capacitance of the NMOS devices in the OFF state. As known to the person skilled in the art, the Ron of a regular NMOS device biased at a given voltage is higher than the Ron of a native NMOS device biased at the same voltage. Therefore, in such a tradeoff, the transistor designs are larger to achieve an acceptable Ron. The Coff of these larger designs will also be higher, and this will result in an overall performance degradation of the circuit at higher frequencies.

SUMMARY

Methods and devices described in the present disclosure address the antenna termination issue while in the unpowered condition as described above. The disclosed methods and devices provide solution to the issue without compromising the overall performance of the electronic circuit in the powered conditions.

According to a first aspect of the disclosure, an electronic circuit is provided, comprising: a) an RF switching circuit comprising transistors having a first threshold voltage; b) a termination circuit configured to be connected to the RF switching circuit, the termination circuit comprising a series connection of a first switch and a termination impedance, the first switch comprising one or more transistors having the first threshold voltage, the series connection including a node configured to receive a signal; c) a second switch between the termination circuit and the RF switching circuit, the second switch configured to connect the termination circuit with the switching circuit, the second switch comprising one or more transistors with a second threshold voltage, wherein the second threshold voltage is different from the first threshold voltage; wherein the first and the second threshold voltages are such that: i) in a powered condition of the electronic circuit: the first switch is in an OFF state; and the second switch is in an ON state, thereby connecting the termination circuit to the RF switching circuit; and ii) in an unpowered condition of the electronic circuit: the first switch is in an ON state, and the second switch is in an OFF state, thereby decoupling the RF switching circuit from the termination circuit.

According to a second aspect of the disclosure, a method of terminating an antenna of an electronic circuit in absence of power supplies, the electronic circuit including a switching circuit with a terminating impedance is disclosed, the method comprising: coupling the antenna to the terminating impedance, having a desired impedance value, through a first switch comprising one or more native NMOS transistors; coupling the antenna to the switching circuit through a second switch comprising one or more regular NMOS transistors; removing the power supplies from the electronic circuit, thereby: turning the first switch to an ON state, thereby terminating the antenna with the terminating impedance; and decoupling the antenna from the switching circuit through the second switch.

Further aspects of the disclosure are provided in the description, drawings and claims of the present application.

DETAILED DESCRIPTION

Figure 2:
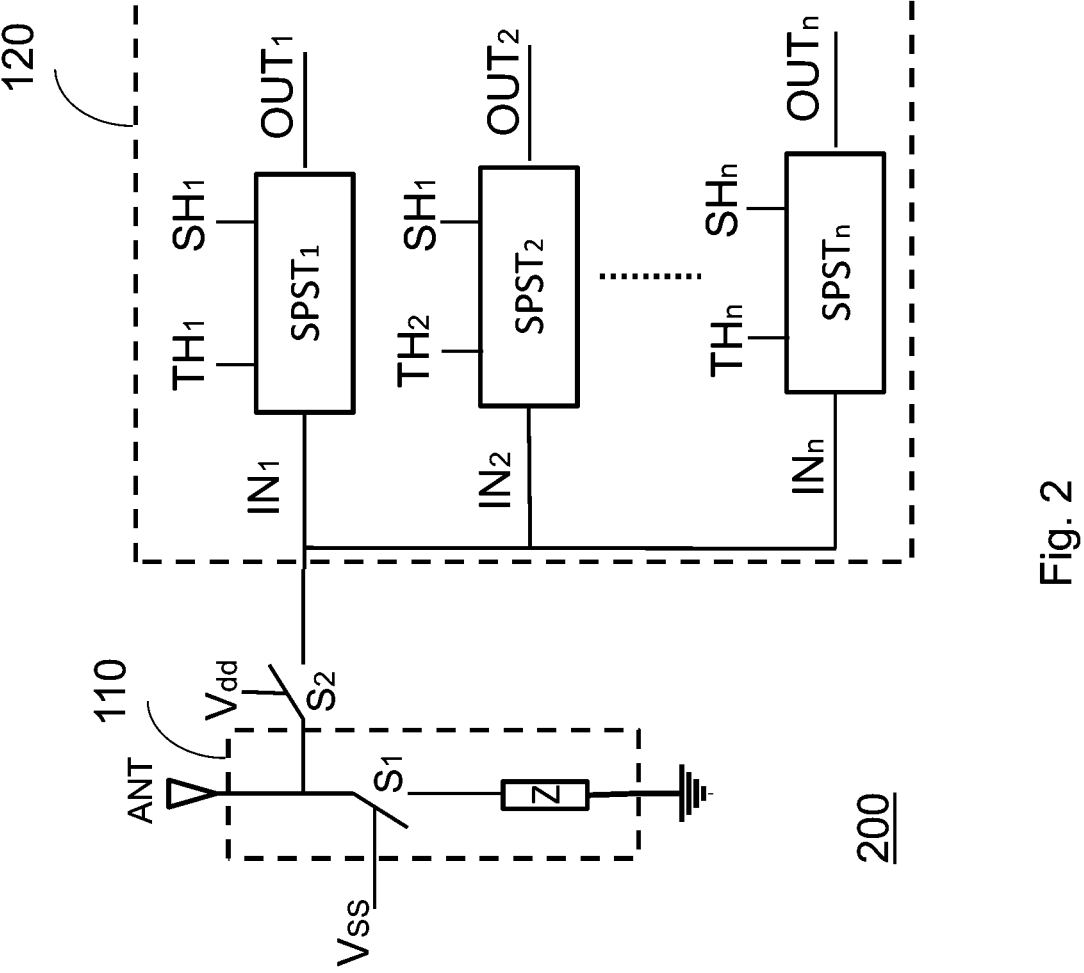
FIG. 2 shows an exemplary electronic circuit in accordance with an embodiment of the present disclosure.

FIG. 2 shows an electronic circuit (200) including termination circuit (110) and switching circuit (120) according to an embodiment of the present disclosure. The termination circuit (110) is connectable to antenna (ANT), and comprises switch (S1) controlled by a first supply voltage (Vss), and a termination impedance (Z), serially connected to one another. The switching circuit (120) comprises a plurality of single-pole single-throw (SPST) switches (SPST1, . . . , SPSTn) connecting antenna (ANT) to outputs (OUT1, . . . , OUTn) through respective inputs (IN1, . . . , INn). Each SPST switch (SPSTi), i=1, . . . , n, is controlled by a through control (THi) and a shunt control (SHi). The electronic circuit (200) further comprises a switch (S2) controlled by a second supply voltage (Vdd). In accordance with further embodiments of the present disclosure, supply voltage (Vdd) may provide a positive voltage and the switch (S2) may have a threshold voltage different from those of the switch (S1) and/or the constituent switches of the switching circuit (120). By way of example, and not of limitation, switch (S1) and constituent switches of the switching circuit (120) may be made using native NMOS transistors (i.e. with threshold voltages less than zero volts) and the switch (S2) may be made using regular NMOS transistors (i.e. with a threshold voltage greater than zero volts). In what follows, the functionality of the electronic circuit (200) will be described in more details.

Figure 1A:
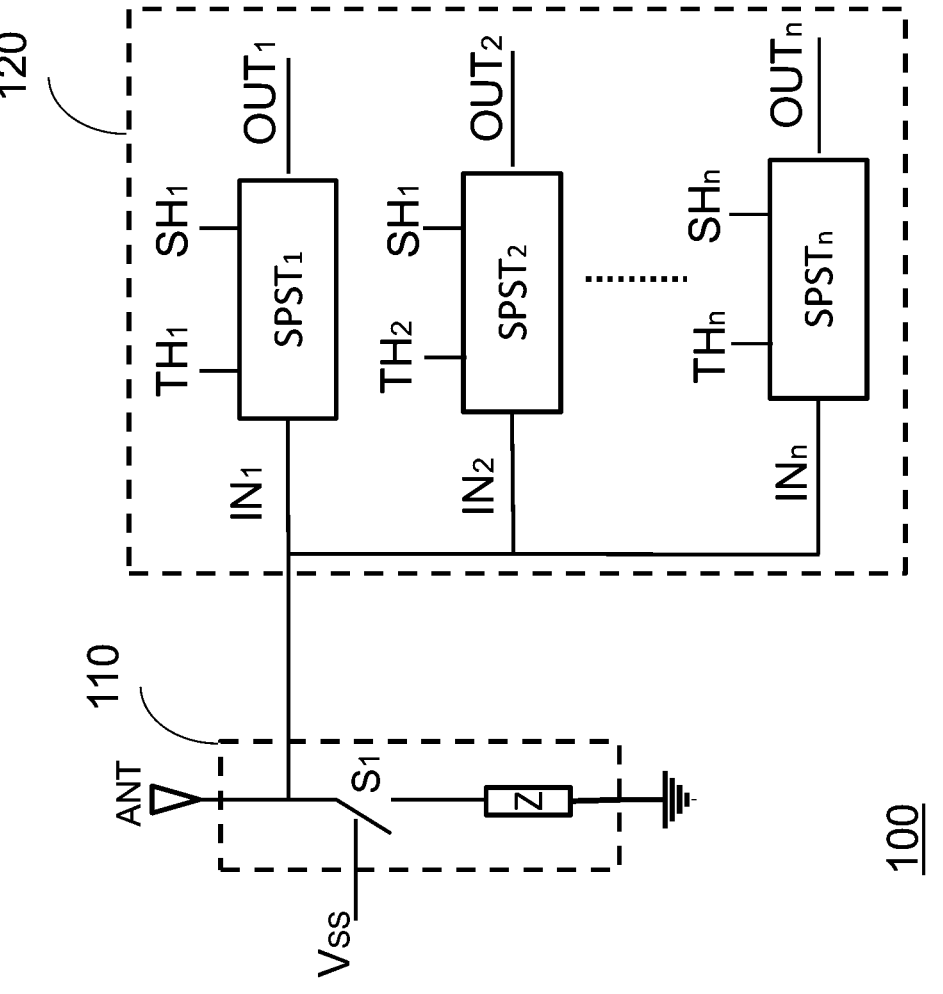
FIG. 1A shows a prior art electronic circuit.

With further reference to FIG. 2, in the powered mode, supply voltage (Vdd) is such that (e.g. positive voltage) the switch (S2) is closed, thereby coupling the antenna and termination circuit (110) to the switching circuit (120). As such, the overall functionality of the electronic circuit (200) in the powered mode is similar to what was described with regards to the electronic circuit (100) of FIG. 1A. Additionally, as switch (S2) is closed, the impact of switch (S2) on such overall functionality is minimal. As an example, the insertion loss of the switch (S2) when closed may typically be just a few hundredths of a dB.

With continued reference to FIG. 2, in the unpowered mode, all the applied bias voltages, including the THi controls, the SHi controls, Vdd, and Vss, are at zero volts. According to an embodiment of the present disclosure, switch (S2) may be implemented using regular NMOS devices. In other words, at zero bias voltage, switch (S2) is open, disconnecting and isolating the switching circuit (120) from the termination circuit (110) and antenna. This means that, as opposed to what was described previously with regards to the electronic circuit (100) of FIG. 1A, in this case, and regardless of the states of constituent switches of the switching circuit (120), the switching circuit (120) will not impact the impedance seen from the antenna as an additional and unwanted load. In accordance with embodiments of the present disclosure, in the unpowered mode, switch (S1) may be implemented using native NMOS devices. This means, switch (S1) will be at least partially closed or not fully open (with zero bias voltage applied) and as a result, the antenna will be terminated by the impedance (Z) which can be implemented based on the design requirements. In view of what was described, the person skilled in the art will appreciate that the disclosed solution addresses the issue of antenna termination in the unpowered mode with almost no impact on the normal functionality of the electronic circuit while in the powered mode.

Figure 1B:
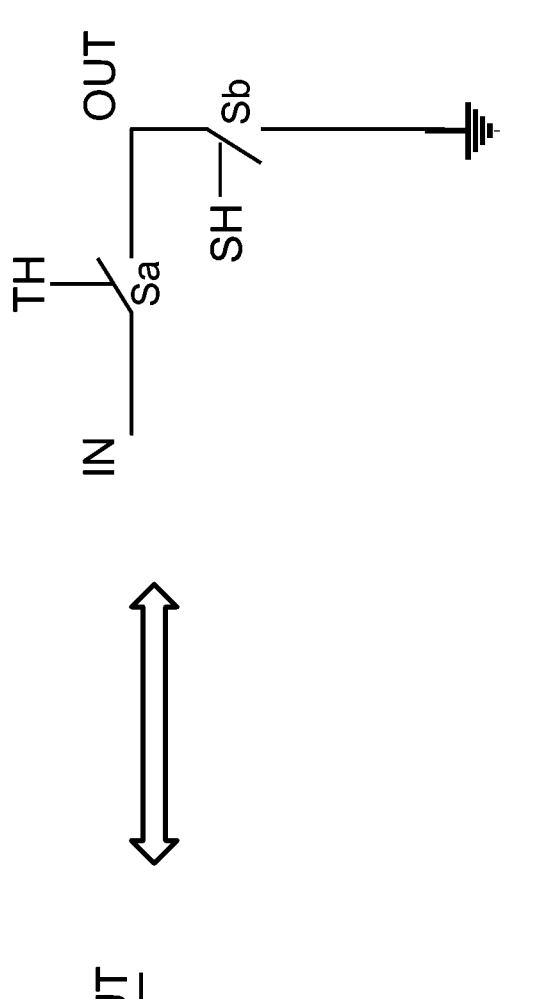
FIG. 1B-1B' show prior art implementations of an SPST.
Figure 1B:
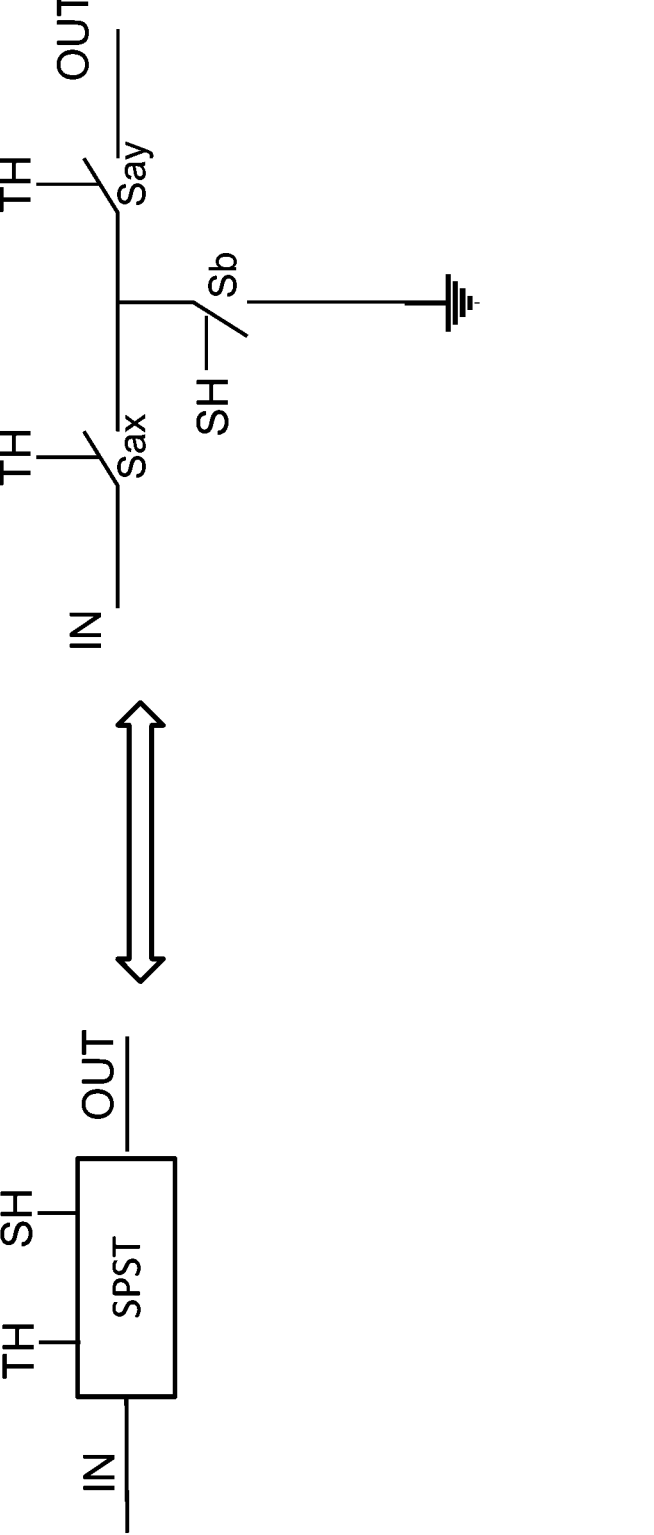
Figure 3:
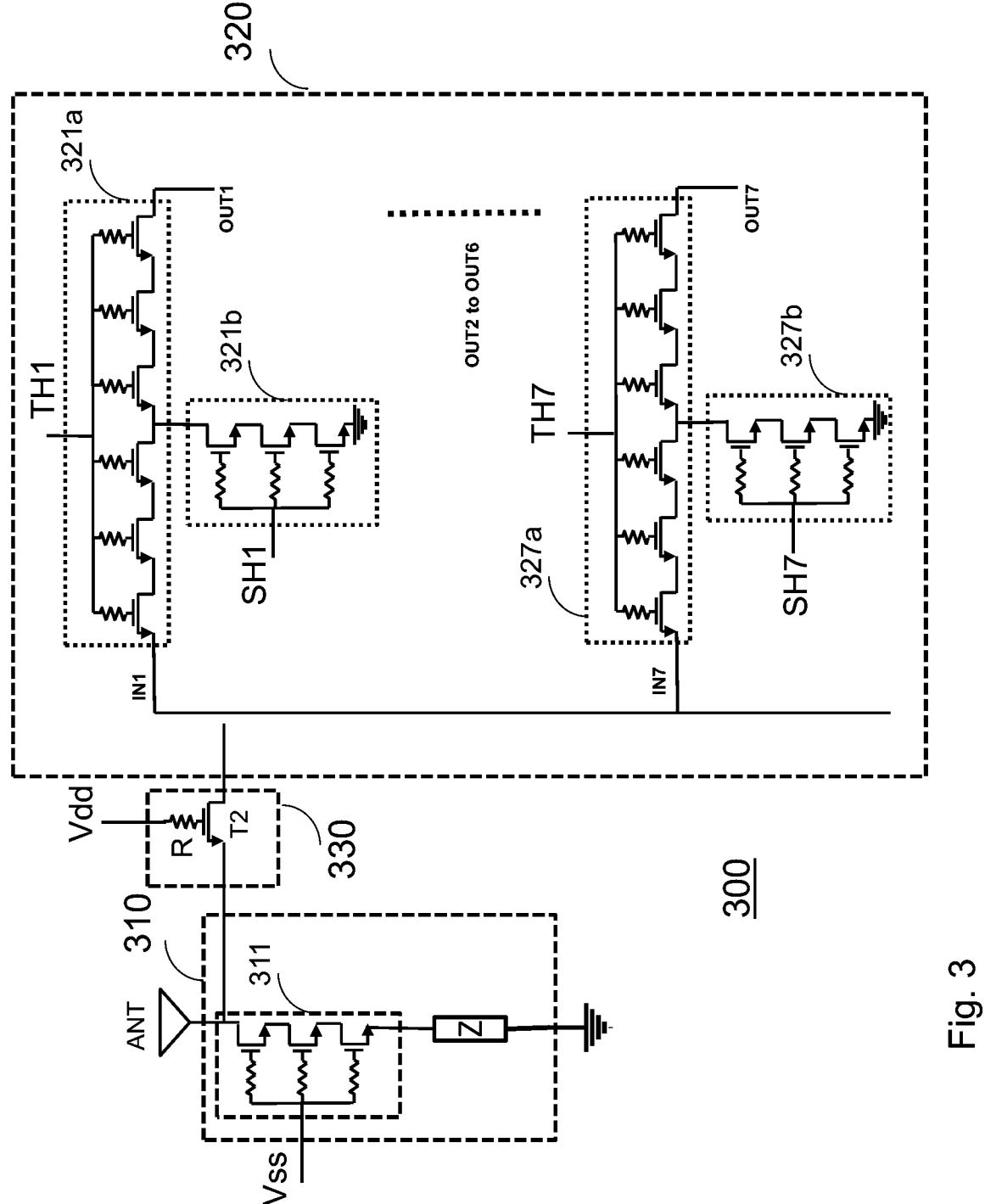
FIG. 3 shows an exemplary electronic circuit in accordance with another embodiment of the present disclosure.

FIG. 3 shows an electronic circuit (300) which is an exemplary implementation of the electronic circuit (200) of FIG. 2. Switch (330) comprises transistor (T2) and resistor (R) and represents an implementation of switch (S2) of FIG. 2. Similarly, switching circuit (320) represents an implementation of switching circuit (120) of FIG. 2. For example, a combination of the blocks (321a, 321b) is an implementation of SPST1 of FIG. 2. Continuing with the same example, block (321a) is essentially a switch stack of 6 serially connected transistors representing an implementation of the through switch (Sa) of FIG. 1B. Similarly, block (321b) comprises a switch stack implementing the shunt switch (Sb) of FIG. 1B. With further reference to FIG. 3, the termination circuit (310) is an exemplary implementation of the termination circuit (210) of FIG. 2, wherein block (311) comprising a switch stack of three serially connected transistors represents an implementation of switch (S1) of FIG. 2.

With further reference to FIG. 3, the functionality of the electronic circuit (300) and the interactions of various elements therein are similar to what was described with regards to electronic circuit (200) of FIG. 2. According to an embodiment of the present disclosure, all the transistors within the switching circuit (320) and the termination circuit (310) are native NMOS devices and transistor (T2) is a regular NMOS device. In the powered condition, Vdd and Vss are positive and negative voltages respectively. As a result, switch (330) is closed and switch (311) is open and the signal received by antenna (ANT) will be routed to one of the outputs (OUT1, . . . , OUT7) depending on the states of blocks (321*a*, 321*b*, . . . , 327*a*, 327*b*). On the other hand, in the unpowered condition, voltages (Vdd, Vss) are both at zero volts. As a result, switch (330) is open isolating switch circuit (320) from the termination circuit (310). Moreover, switch (311) is closed, terminating the antenna (ANT) by a desired impedance (Z). According to an embodiment of the present disclosure, impedance (Z) may be implemented and/or selected according to the requirements (e.g. 50 ohm, open, short, etc.)

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for case of referring to such elements, and do not in themselves indicate a particular required ordering or enumeration of elements; further, such labels may be reused in dependent claims as references to additional elements without being regarded as starting a conflicting labeling sequence).

The invention claimed is:

1. An electronic circuit comprising:
an antenna coupled with a termination circuit and an output node; the termination circuit including a termination impedance and a first switch, the first switch comprising one or more transistors;
a control circuit configured to control the first switch to selectively connect the antenna to the termination impedance in an unpowered condition and to decouple the antenna from the termination impedance in a powered condition.

2. The electronic circuit of claim 1, wherein the first switch comprises native NMOS transistors.

3. The electronic circuit of claim 2, wherein the control circuit is configured to apply a negative bias to the first switch in the powered condition.

4. The electronic circuit of claim 1, further comprising a second switch positioned between the antenna and the output node, the second switch comprising regular NMOS transistors.

5. The electronic circuit of claim 4, wherein the second switch is configured to connect the antenna to the output node in the powered condition and to decouple the antenna from the output node in the unpowered condition.

6. The electronic circuit of claim 5, wherein the second switch comprises a plurality of serially connected transistors.

7. The electronic circuit of claim 6, wherein the first switch also comprises a plurality of serially connected transistors.

8. The electronic circuit of claim 4, wherein the control circuit is configured to apply a first supply voltage to the second switch in the powered condition and to remove the first supply voltage in the unpowered condition.

9. The electronic circuit of claim 8, wherein the control circuit applies zero bias voltage to both the first and second switches in the unpowered condition.

10. The electronic circuit of claim 4, wherein the second switch comprises a plurality of regular NMOS transistors configured to operate in a powered mode with positive and negative supply voltages.

11. The electronic circuit of claim 4, wherein the termination impedance terminates the antenna with a desired impedance in the unpowered condition.

12. The electronic circuit of claim 11, wherein the desired impedance is a 50-ohm impedance.

13. The electronic circuit of claim 1, wherein the first switch comprises a stack of three or more serially connected transistors to provide increased isolation in the unpowered condition.

14. The electronic circuit of claim 1, wherein the output node is connected to a plurality of single-pole single-throw (SPST) switches.

15. The electronic circuit of claim 14, wherein each SPST switch comprises a through switch and a shunt switch.

16. A method for controlling termination of an antenna in an electronic circuit, comprising:
selectively coupling or decoupling the antenna to/from an output node;
providing a termination circuit with a termination impedance and a first switch;
providing a control circuit to control the first switch;
in a powered condition, maintaining the first switch in an OFF state, thereby decoupling the antenna from the termination impedance;
in an unpowered condition, switching the first switch to an ON state, thereby terminating the antenna with the termination impedance.

17. The method of claim 16, further comprising using native NMOS transistors in the first switch.

18. The method of claim 17, wherein the control circuit applies a negative voltage to the first switch in the powered condition.

19. The method of claim 16, further comprising providing a second switch configured to decouple the antenna from the output node in the unpowered condition.

20. The method of claim 19, further comprising applying a positive supply voltage to the second switch in the powered condition to couple the antenna to the output node, and applying zero-bias voltage to the first and second switches in the unpowered condition to decouple the antenna from the output node and terminate the antenna with the termination impedance.

* * * * *